United States Patent [19]

Adachi et al.

[11] Patent Number: 5,057,336
[45] Date of Patent: Oct. 15, 1991

[54] METHOD OF FORMING HIGH PURITY SIO₂ THIN FILM

[75] Inventors: Etsushi Adachi; Hiroshi Adachi; Osamu Hayashi; Kazuo Okahashi, all of Amagasaki, Japan

[73] Assignee: Mitsubishi Denki Kabushiki Kaisha, Japan

[21] Appl. No.: 532,231

[22] Filed: Jun. 5, 1990

Related U.S. Application Data

[63] Continuation of Ser. No. 304,474, Feb. 1, 1989, abandoned.

[30] Foreign Application Priority Data

Feb. 3, 1988 [JP] Japan ................... 63-24304

[51] Int. Cl.⁵ ............................................. B05D 3/06
[52] U.S. Cl. ........................................ 427/44; 427/12; 427/126.3; 427/226; 427/251; 427/252; 427/255; 525/474; 528/10; 528/24; 65/31; 65/33
[58] Field of Search ................ 525/474; 528/10, 24; 65/31, 33; 427/12, 44, 126.3, 226, 251, 252, 255

[56] References Cited

U.S. PATENT DOCUMENTS 4,349,609  9/1982  Takeda et al. .................. 428/447
4,723,978  2/1988  Clodgo et al. .................. 156/663

FOREIGN PATENT DOCUMENTS 64-26639  1/1989  Japan .

OTHER PUBLICATIONS

Bytherus et al, "O₂ Plasma-Converted Spin-On Glass for Planarization", J. Vac. Sci. Technol. B, 3(5), Sep.-/Oct. 1985, pp. 1352-1356.

Primary Examiner—Melvyn I. Marquis
Attorney, Agent, or Firm—Leydig, Voit & Mayer

[57] ABSTRACT

A material for forming a high purity thin film which includes a silicone ladder polymer dissolved in an organic solvent is applied to a substrate to form a thin film thereon. The thin film is then heated, thereby removing the solvent and simultaneously curing the thin film. Subsequently, the cured thin film is exposed to an oxygen plasma to form a high purity SiO₂ thin film on the substrate. Although the method consists of simple processes and employs low treatment temperatures, it is capable of forming a high purity SiO₂ thin film which exhibits excellent step coverage and high dielectric breakdown strength.

4 Claims, No Drawings

METHOD OF FORMING HIGH PURITY SiO$_2$ THIN FILM

This application is a continuation of application Ser. No. 07/304,474, filed Feb. 1, 1989, now abandoned.

BACKGROUND OF THE INVENTION

1. Field of the Invention

The present invention relates to a method of forming SiO$_2$ thin films of high purity and, more specifically, to a method of forming a high purity SiO$_2$ thin film which may be used, for instance, as an interlayer insulator between, e.g., aluminum wiring, a passivating film, a step coverage material, or a buffer material for a semiconductor device, and as an insulating layer for a magnetic head.

2. Description of the Related Art

Hitherto, SiO$_2$ thin films have often been used as dielectric layers and passivating layers of solid-state devices in the preparation of semiconductor devices. Among the various methods of forming SiO$_2$ thin films, one method has been examined from the viewpoint of planarizing the surfaces of the relevant devices. In this method, a solution of a silicone compound in an organic solvent is applied to the surface of the device while the device is being rotated. The resultant coating is dried and then subjected to heat treatment whereby the decomposition and the evaporation of organic substances proceed together with a polymerization reaction to form an SiO$_2$ thin film.

In a method in which an organic solvent solution of a silicone compound is applied to the device being rotated, the decomposition and the evaporation of organic substances proceed together with the polymerization reaction upon the drying of the device after the coating process and subjecting the device to heat treatment. In order to achieve a thin film with increased density, the heat treatment is effected at 1100° C. Thus, heat treatment at a high temperature of 1100° C. is necessary with this method, in order to obtain a SiO$_2$ thin film with good quality.

Another method is adopted from the view point of employing a low temperature as the film forming temperature. In this method, an SiO$_2$ thin film is formed in a plasma CVD (chemical vapor deposition) process using, as raw materials, a nitrogen oxide gas and a silane gas diluted with a hydrogen or argon gas.

More specifically, in this method utilizing plasma CVD, a substrate heated to a temperature of 300° to 400° C. is placed in a vacuum chamber, and silane and nitrogen oxide which serve as raw materials are introduced into the chamber along with gases used for dilution, such as hydrogen, helium, and argon. While the internal pressure is maintained at a pressure on the order of 1 Torr, the gases within the chamber are subjected to a glow discharge in which plasma energy causes the generation of silicon ions, oxygen ions, neutral radicals and the like, which are then deposited on the substrate to form an SiO$_2$ thin film.

With a method utilizing plasma CVD, the composition ratios of the silicon and oxygen have to be adjusted, and, in addition, optimal gas pressures, partial pressures, gas flow rates, and discharge power must be attained in order to achieve a further improvement in the quality of the film. Thus, this method requires a series of complicated operations for controlling the quality of the film (see "Hakumaku Handbook (Thin Film Handbook)", page 235, published by K. K. Ohm, 1983).

The above-described method also encounters the following problems. Namely, it is impossible to prevent the SiO$_2$ thin film being formed from becoming contaminated by impurities such as part of the diluent gases or materials forming the chamber wall and so forth. Further, since the deposition rate of a film is usually 2 to 300 Å per minute, the formation of a thin film takes a relatively long time. Still further, since residual stress of the film will be generated to the extent of about $5 \times 10^9$ dyne/cm$^2$, cracks may be formed. Finally, step coverage is inadequate.

SUMMARY OF THE INVENTION

The present invention has been accomplished to eliminate the above-described problems, and an object of the present invention is to provide a method of forming a high purity SiO$_2$ thin film on a substrate solely using a material for forming a high purity SiO$_2$ thin film, effecting heat treatment at low temperatures, and, thereafter, effecting oxygen plasma treatment.

According to the present invention, a method of forming a high purity SiO$_2$ thin film comprises the steps of: coating the surface of a substrate with a material for forming a high purity thin film, thereby forming a thin film on the surface of the substrate, the material including an organic solvent and a silicone ladder polymer expressed by the following general formula (1)

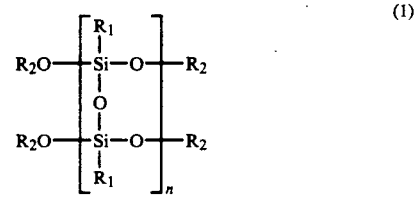

(where R$_1$ represents a phenyl group or a lower alkyl group; R$_2$ represents a hydrogen atom, a methyl group, or an ethyl group; and n represents any integer of from 2 to 1000); heating the thin film, thereby driving off the solvent within the thin film and simultaneously curing the thin film; and treating the cured thin film with an oxygen plasma or oxygen ions.

DESCRIPTION OF THE PREFERRED EMBODIMENTS

The material for forming a high purity SiO$_2$ thin film which is used in the method in accordance with the present invention comprises a silicone ladder polymer and an organic solvent.

This silicone ladder polymer is a high purity silicone ladder polymer which contains an alkali metal, iron, lead, copper, and hydrogen halide in respective amounts of 0.1 ppm or less, and uranium and thorium, which are radioisotopes, in respective amounts of 0.1 ppb or less. The silicone ladder polymer has a composition SiO$_{3/2}$, and it basically has, in its molecule, regular trifunctional siloxane bonds. It is expressed by the following general formula (1):

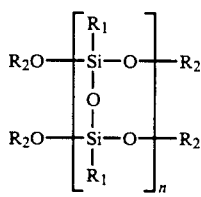

$$(1)$$

(where $R_1$ represents a phenyl group or a lower alkyl group; $R_2$ represents a hydrogen atom, a methyl group, or an ethyl group; and n represents any integer of from 2 to 1000). By virtue of the use of this high purity silicone ladder polymer, the material for forming an $SiO_2$ thin film possesses excellent storage stability. After the coating has been performed, it is treated with oxygen plasma or oxygen ions within a high purity quartz chamber while the coating is shielded from any direct exposure to the electrode. Thus, the method of the present invention is capable of providing a high purity $SiO_2$ thin film with good quality, without the need for effecting heat treatment at high temperature.

It is not desirable that individual alkali metals, such as potassium or sodium, iron, lead, copper, and hydrogen halide contaminants in the silicone ladder polymer, exceed 0.1 ppm, because when the thin film is used as a dielectric film, if these components enter into the dielectric film, they may act as mobile ions, leading to a reduction in dielectric strength, as well as to a degradation of the metal wiring. Further, if the content of either uranium or thorium exceeds 0.1 ppb, increased the radiation of $\alpha$-rays is expected, which in turn may lead to the inversion of the memory state when the thin film is used in a memory device. If such were the case, the device may operate erroneously, thus resulting in the phenomenon known as soft error.

Preferred examples of $R_1$ shown in the general formula (1) include lower alkyl groups, a phenyl group, a methyl group, an ethyl group, and a propyl group which impart excellent thermal decomposition properties to the silicone ladder polymer. On the other hand, examples of $R_2$ include a hydrogen atom, a methyl group, and an ethyl group which are excellent in inter-terminal condensation reaction.

The integer n should be an integer of from 2 to 1000, preferably, from 10 to 200. If n is less than 2, it would be difficult to form a coating of the silicone ladder polymer.

The material for forming a high purity $SiO_2$ thin film which is used in the method of the present invention is obtained by dissolving the above-described silicone ladder polymer in an organic solvent. Examples of organic solvents include aromatic hydrocarbons such as toluene, xylene and benzene, ketone solvents such as methyl ethyl ketone and acetone, ether solvents such as tetrahydrofuran, diethyl ether and isopropyl ether, ethyl cellosolve, and N-methyl-pyrrolidone. Aromatic hydrocarbons are preferable because they can be handled without generating bad odors and are not particularly harmful to humans, and because they are non-polar solvents and do not absorb moisture easily.

The silicone ladder polymer should preferably be dissolved in the organic solvent at a concentration of from 5 to 30% (percentage by weight, abbreviated as % hereinafter). If the concentration is less than 5%, making it possible to form a very thin film, it simultaneously makes it difficult to control the thickness of the film by controlling the rotational speed of the spinner used. On the other hand, if that content exceeds 30%, the viscosity of the solution becomes excessively high, and this tends to result in the formation of a coating with an uneven surface while rotating the substrate. Thus, in order to obtain an $SiO_2$ thin film with optimal quality, a solution having a concentration of from 5 to 30% should preferably be used.

Next, an explanation will be given below concerning the manner in which a high purity $SiO_2$ thin film is formed employing the above-described material for forming a high purity $SiO_2$ thin film.

First, the material for forming a high purity $SiO_2$ thin film is applied to a substrate by a coating method such as one in which the substrate is rotated by a spinner, by a screen printing method, or by a potting method. Subsequently, precuring is effected at a temperature of from 50° to 90° C. for a period of from 30 to 60 minutes, thereby driving off part of the solvent. Further, heat treatment is effected first employing a temperature of from 100° to 200° C. for 30 to 60 minutes, then employing a temperature of from 350° to 450° C. for 60 to 90 minutes, thereby completely driving off the solvent, and simultaneously causing a condensation reaction between the terminals of the silicone ladder polymer, curing the film. The resultant thin film should preferably have a thickness of from 0.4 to 1.5 μm.

Subsequently, the resultant substrate is placed in a high purity quartz chamber, and the interior of the chamber is kept under a vacuum of below $10^{-3}$ or $10^{-5}$ Torr for a period of from 15 to 60 minutes, thereby removing any gases which might have become mixed in the coating as impurities. Thereafter, high purity oxygen (having a purity level of 99.999%, this purity applying throughout the specification) is introduced into the quartz chamber. If, for instance, a RF (radio frequency) plasma is to be generated, AC power, e.g., 13.56 MHz RF power of from 100 to 500 W, is applied from the outside of the quartz chamber using capacitive coupling or inductive coupling. The oxygen flow rate is maintained constant within the range of from 5 to 200 cc/min, and the pressure is maintained constant within the range of from 0.5 to 2 Torr. In this way, the high purity oxygen is subjected to a glow discharge, thereby generating an oxygen plasma. At this time, in order to uniformly effect the oxygen plasma treatment, the amount of oxygen introduced, the pressure, and the RF power are kept constant. These conditions of oxygen plasma treatment can be adjusted much more easily than the plasma treatment conditions that must be adjusted in the case where an $SiO_2$ thin film is formed by a conventional method utilizing a plasma CVD. The film is treated with the oxygen plasma for 20 to 30 minutes, whereby the organic components remaining on the substrate are transformed into carbon dioxide gas, etc., and are thus removed. Simultaneously, oxygen ions in the plasma substitute for the organic substances to form a high purity $SiO_2$ thin film.

The plasma chamber is formed of high purity quartz. Further, in the case where RF power is used, the electrode for effecting glow discharge is disposed on the outside of the chamber. Also, when a microwave discharge is effected, the region where plasma is generated and the position where the film is treated are separate. By virtue of this arrangement, it is possible to prevent impurities such as alkali metal, iron, lead, copper, uranium, thorium from contaminating the $SiO_2$ film.

The manner in which the oxygen plasma or oxygen ions are supplied is not limited to the above-described one in which a plasma is used. Instead, a light-driven apparatus may be used. Further, a microwave plasma or an ECR (electron cyclotron resonance) plasma may be used instead of an RF plasma.

Still further, although in the explanation given above, the plasma treatment is effected after the terminal condensation reaction has taken place to cure the thin film. Similar effects may be provided by effecting the plasma treatment in the following manner: After the coating process performed while rotating the substrate, the resultant substrate is placed in a quartz chamber in which a heater is disposed. After the interior of the chamber has been maintained under a high degree of vacuum, and the solvent has been removed, plasma treatment is effected while the substrate is being heated at a temperature of from 200° to 300° C.

A high purity $SiO_2$ thin film obtained in the above-described manner may be advantageously used as, for instance, an interlayer insulator between, e.g., aluminum wiring, a passivating film, a step coverage material, or a buffer material of a semiconductor device, or as an insulating layer of a magnetic head. Since the method of the present invention employs low processing temperatures, the thin film may be particularly advantageously used when the substrate is formed of a material having a relatively low thermal resistance or when the relevant device comprises a compound semiconductor, such as GaAs.

The method of forming a high purity $SiO_2$ thin film in accordance with the present invention will be described hereunder in further detail with respect to Examples. However, it should be understood that the present invention is not limited to these Examples.

EXAMPLES

A material for forming a high purity $SiO_2$ thin film was prepared by dissolving a high purity silicone ladder polymer in toluene prepared for use in electronic industries at a concentration of 10%. The high purity silicone ladder polymer contained an alkali metal, iron, lead, copper, and hydrogen halide in respective amounts of 0.1 ppm or less, and uranium and thorium in respective amounts of 0.1 ppb or less. This polymer had a mean molecular weight of 8000, and it was expressed by the following general formula:

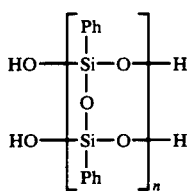
(1)

For the purpose of forming an interlayer insulator in a semiconductor device, the resultant material was evenly applied to the semiconductor device while the device was rotated by a spinner. After the resultant device had been dried at 60° C. for 30 minutes, heat treatment was effected at 150° C. for 30 minutes, thereby completely removing the solvent. Further heat treatment was effected at 350° C. for 60 minutes, thereby causing condensation at the molecular terminals of the silicone ladder polymer. The film had a thickness of 0.7 μm.

Subsequently, the semiconductor device was placed in a high purity quartz chamber, and the interior of the chamber was maintained under a vacuum of $10^{-5}$ Torr for 15 minutes. Thereafter, high purity oxygen was introduced into the chamber. 13.56 MHz RF power of 400 W was applied from the outside of the quartz chamber using capacitive coupling, while the oxygen flow rate and the pressure were respectively kept constant within the range of from 5 to 200 cc/min and the range of from 0.5 to 2 Torr. In this way, an oxygen plasma was generated, with which the film was treated for 20 minutes.

An aluminum electrode having a dimension of 1 mm² was provided on the thus formed thin film, to measure the dielectric breakdown electric field. As a result, values of from 8 to 9 MV/cm were obtained. When the refractive index of the thin film was measured by ellipsometry, a refractive index of 1.47 was obtained. When the internal stress was calculated on the basis of the deformation of the substrate, an internal stress of $1 \times 10^8$ dyne/cm² was obtained, thereby ensuring that, if the thin film is used in a semiconductor device, the film suffers from only a low level of stress. Thus, it was found that the method of the present invention is very effective in achieving an improvement in reliability.

Although in the above-described example, a plasma asher was used as a means for supplying oxygen plasma or oxygen ions, similar effects were obtained by, for instance, using a light-driven apparatus, or by using microwave plasma or ECR plasma instead of RF plasma, as will be illustrated in the following three examples.

In the case where a light-driven apparatus was used, oxygen was excited by the use of a mercury vapor lamp of 400 W provided on the outside of a high purity quartz chamber, thereby generating oxygen ions and active radicals. The oxygen pressure was kept constant at $1 \times 10^{-1}$ Torr, and the treatment was effected for 30 minutes.

In the case where a microwave plasma apparatus was used, 2.45 GHz microwaves of 150 W power were introduced through a waveguide into a high purity quartz chamber, thereby causing a microwave discharge. The oxygen pressure was kept constant at $10^{-2}$ Torr, and the treatment was effected for 30 minutes.

In the case where an ECR plasma apparatus was used, 2.45 GHz microwaves were used, and a magnetic field of 875 gauss was applied, thereby causing electron cyclotron resonance. An oxygen plasma was generated in a plasma chamber, and oxygen ions were introduced into the chamber by the use of a divergent magnetic field, to treat a silicone ladder polymer that was placed in the chamber. The treatment was effected using microwaves of at a power 200 W, under a pressure of $5 \times 10^{-3}$ Torr for 30 minutes.

Although in the above-described examples, the plasma treatment was effected after the terminal condensation reaction, curing the thin film, in a further example, the plasma treatment was effected in the following manner: After the coating process had been performed while rotating a substrate, the resultant substrate was placed in a quartz chamber equipped with a heater. Plasma treatment was effected while the substrate was being heated. Also in this way, similar effects were obtained.

As described above, the method of the present invention is adapted to form a coating using a material for forming a high purity $SiO_2$ thin film, to effect heat treatment at low temperatures, and to effect oxygen plasma treatment. Accordingly, although the method consists of simple processes and employs low treatment temperatures, it is capable of forming a high purity $SiO_2$ thin film which exhibits excellent step coverage and the same or a higher level of dielectric breakdown strength as compared with a conventional spin-on glass (SOG) thin film prepared by heat treatment alone or a conventional $SiO_2$ thin film prepared by plasma CVD.

What is claimed is:

1. A method of forming a high purity $SiO_2$ thin film comprising:

coating a surface of a substrate with a film of a solution comprising an organic solvent and a silicone ladder polymer having the general formula

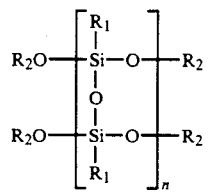

where $R_1$ represents a phenyl group or a lower alkyl group; $R_2$ represents a hydrogen atom, a methyl group, or an ethyl group; and n is any integer from 2 to 1000 wherein said silicone ladder polymer contains less than 0.1 parts per million of alkali metals, iron, lead, copper, and hydrogen halide and less than 0.1 parts per billion of uranium and thorium;

heating said film, thereby driving off said solvent and simultaneously curing said film; and exposing the cured film to an oxygen plasma at a pressure from $5 \times 10^{-3}$ Torr to 2 Torr.

2. A method according to claim 1 including, while exposing the cured film to the oxygen plasma, heating the cured film.

3. A method according to claim 1 including, before coating the surface of the substrate with the solution, preparing the solution for coating the substrate by dissolving said silicone ladder polymer in said organic solvent in a concentration of from 5 to 30 percent by weight.

4. A method according to claim 1 wherein n is in the range of 10 to 200.

* * * * *